July 16, 1963 E. L. BLEIER ETAL 3,098,177

UNIVERSAL CELL FOR PRINTED CIRCUIT BOARDS

Filed Sept. 15, 1961 2 Sheets-Sheet 1

INVENTORS.
ERNEST L. BLEIER
THADDEUS W. KUCHARSKI
BY Samuel R. Genca
AGENT 3,098,177
Patented July 16, 1963

3,098,177

UNIVERSAL CELL FOR PRINTED CIRCUIT BOARDS

Ernest L. Bleier, Fairport, and Thaddeus W. Kucharski, Rochester, N.Y., assignors to General Dynamics Corporation, Rochester, N.Y., a corporation of Delaware Filed Sept. 15, 1961, Ser. No. 138,516
6 Claims. (Cl. 317—101)

The present invention relates to an enclosure and, more particularly, to a universal cell for housing printed circuit boards and electrical connectors.

Although the present invention is suited for more general applications, it is particularly suited for telephone and computer circuit installations utilizing libraries of printed circuit boards and plug and socket connectors. The printed circuit boards in these libraries are judiciously grouped and separately packaged, and plug and socket connectors are used for bringing these packages or "modules" into cooperative electrical relation. In such installations, it is desirable to house the printed circuit boards and connectors in a relatively small amount of installation space and to mount the printed circuit boards into an enclosure which is compact, light in weight, offers effective cooling, and is relatively inexpensive to manufacture.

Prior art printed circuit board enclosures in general comprise a frame having an open front, a plurality of pairs of printed circuit board channel guides welded or fastened to the frame, and a panel for mounting a plurality of printed circuit board electrical connectors. The connectors are aligned with the printed circuit board and the printed circuit board channel guides. While satisfactory for the purpose intended, prior art enclosures have been relatively inflexible to changes in printed circuit board arrangements. Further disadvantages reside in the provision of mounting and aligning the printed circuit board channel guides with the panel mounted connectors. As to cost, generally, spare printed circuit board channel guides were included in the enclosure to allow for changes and additions in the printed circuit board arrangements. Thus, the initial cost of the printed circuit board enclosure included the cost of spare components which would probably not be used.

Accordingly, one object of the present invention is to provide a novel and improved universal cell for mounting libraries of printed circuit boards and electrical connectors.

It is another object of the present invention to provide a novel and improved universal cell for printed circuit boards and electrical connectors which is low in cost to manufacture, easy to maintain, and may be modified at a relatively low cost.

It is still another object of the present invention to provide a universal cell characterized by the provision of a means for facilitating the alignment and the insertion and removal of printed circuit boards from their respective electrical connectors.

It is yet another object of the present invention to provide quick removal and/or addition of supporting structure for printed circuit boards and electrical connectors to effect modification of the printed circuit board and capacity of the cell.

Another object of the present invention is to provide self-alignment between the individual printed circuit boards and their associated electrical connectors.

It is still another object of the present invention to provide a skeletal cell having interlocking novel means for releasably interconnecting printed circuit board channel guides and electrical connectors so as to form a mechanically rigid construction.

The present invention accomplishes the above-cited objects by providing a universal cell for printed circuit boards and connectors comprising a spatial skeletal frame and a plurality of pairs of spaced-apart printed circuit board channel guides spanningly supported by the frame. The frame includes movable upper front and fixed upper rear, longitudinally extending, slotted support beams, and movable lower front and fixed lower rear, longitudinally extending, slotted support beams for spanningly supporting the plurality of pairs of printed circuit board channel guides in vertical and horizontal alignment at given uniformly spaced points along the longitudinal axis of the fixed upper and lower support rear beams. In accordance with the invention, the printed circuit boards and connectors are vertically supported by and between the pair of printed circuit board channel guides. Each of the channel guides includes apertures at the given uniformly spaced points for receiving one end of the connectors. The channel guides further include, at diametrically opposite ends, T tabs to coact with the slots in the front and rear beams. Further included are adjusting means coupled to the movable upper front and lower front beams for adjusting the separation distance between the front and rear beams.

In operation, upon outward movement of the front beams by the adjusting means, the channel guides and connectors are simultaneously interlocked in the frame, the connector being captive between the pair of channel guides and the channel guides being captive between the front and rear beams. Upon inward movement of the front beams by the adjusting means, all the connectors are releasable from the channel guides, and all the channel guides are releasable from the front and rear beams.

Other objects and advantages of the present invention will become apparent from the ensuing description of an illustrative embodiment thereof in the course of which reference is had to the accompanying drawings in which.

Figures 1, 4:
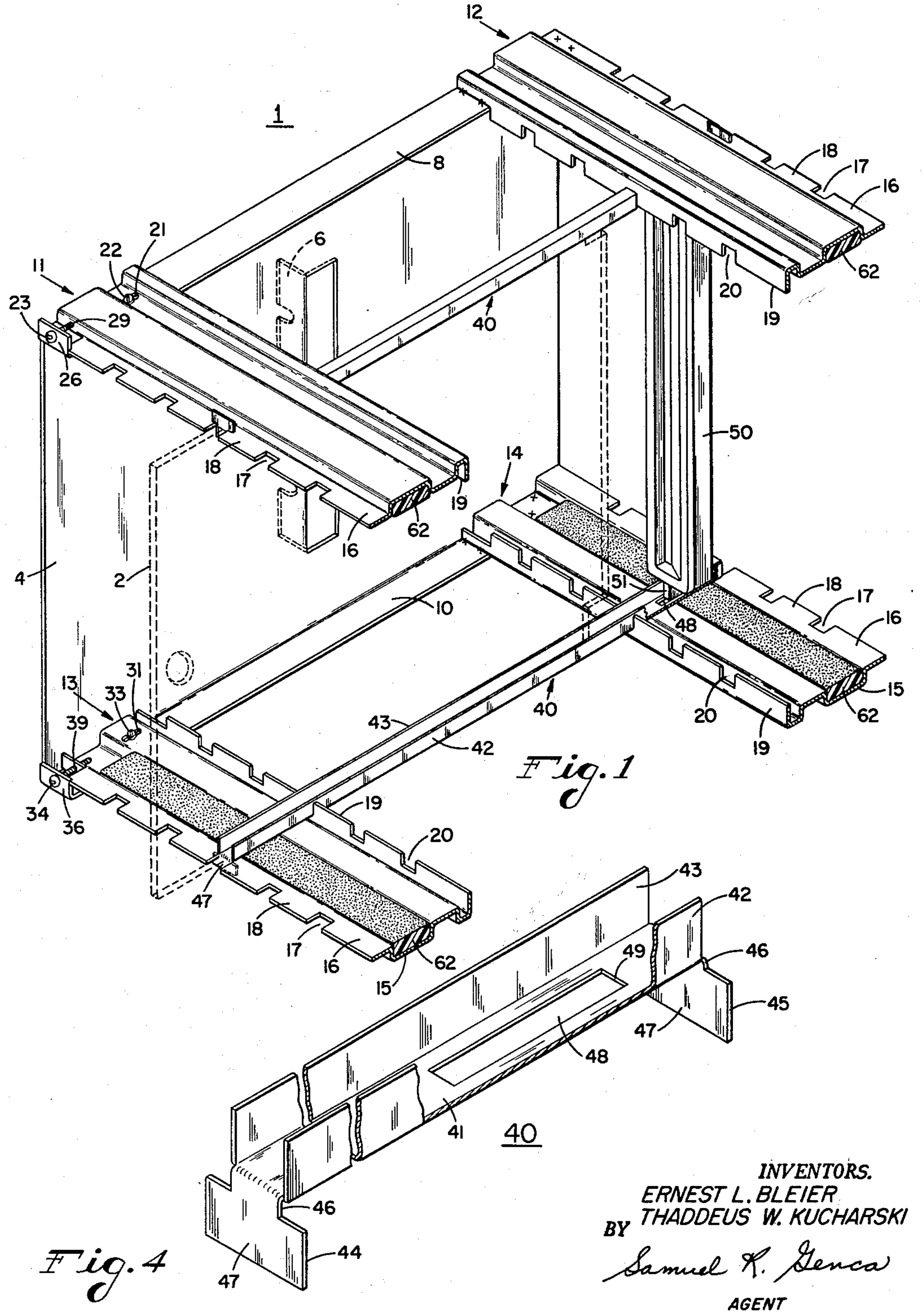
FIGURE 1 is a cutaway view in perspective of a universal cell embodying the features of the invention.
FIGURE 4 is a perspective view of a printed circuit board channel guide employed in FIGURES 1–3.
Figures 2, 3:
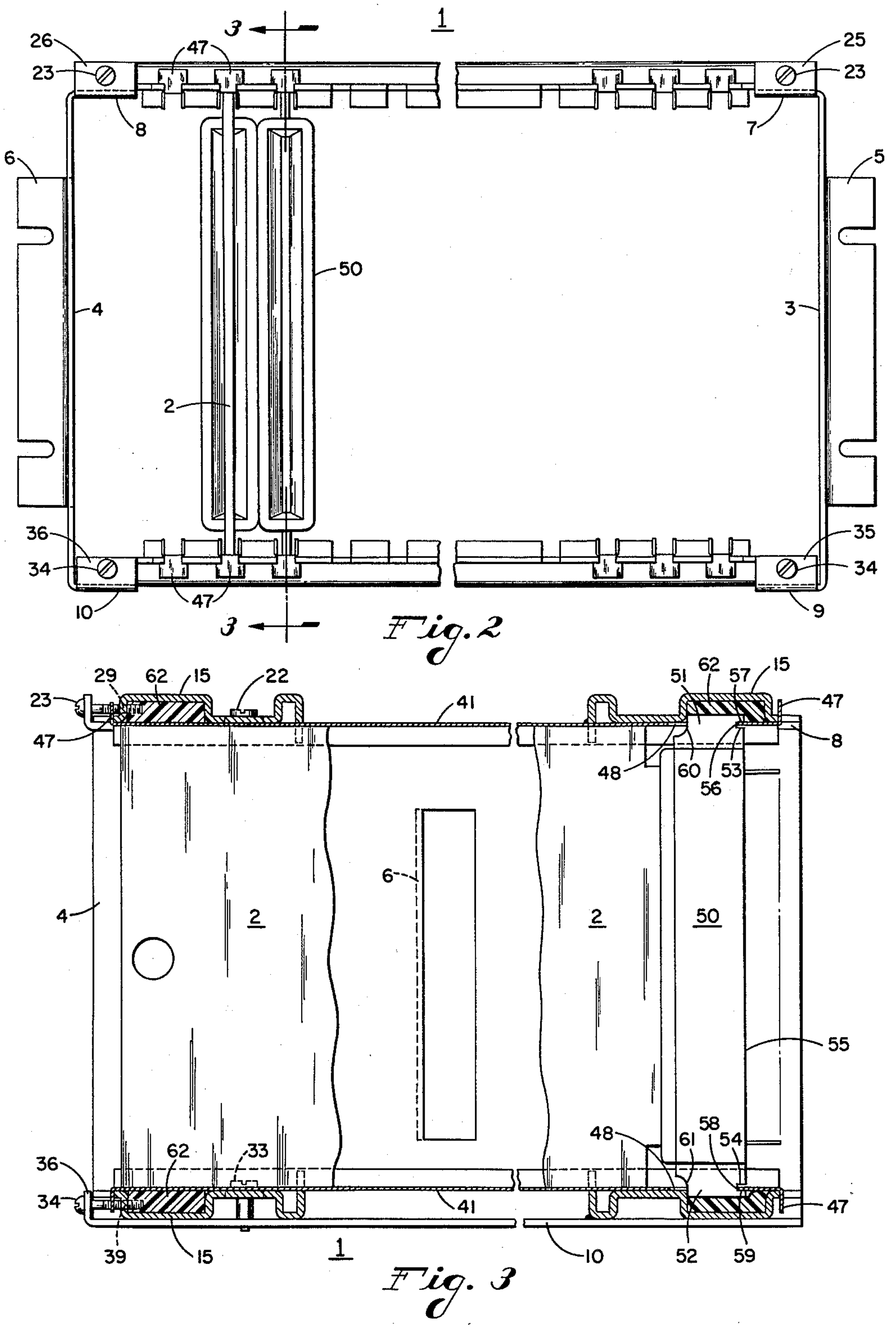
FIGURE 2 is a front view of the universal cell showing two electrical connectors and an edge of a printed circuit board.
FIGURE 3 is a side view of FIGURE 2 in cross-section taken through line 3—3.

Referring now to the drawings and more particularly to FIGURE 1, a printed circuit board 2 is shown partly inserted in the universal cell 1 in phantom view by dotted lines. The universal cell 1 can accommodate, as required, a plurality of printed circuit boards 2 in spaced parallel relation. The universal cell 1 comprises a spatial skeletal frame having vertical right and left wall members 3 and 4, respectively, and a plurality of pairs of printed circuit board channel guides 40. The right wall member 3 is omitted from FIGURE 1 in order to show the details of the invention. However, the right wall member 3 is shown in FIGURE 2. The right and left wall members 3 and 4 include right and left notched rack mounting flanges 5 and 6, respectively, for mounting the cell in a cabinet or rack. Each of the right and left wall members 3 and 4 further include inwardly turned upper right and upper left wall brackets 7 and 8, respectively, lying substantially in a first plane. Each of the right and left wall members 3 and 4 further include inwardly turned lower right and lower left wall brackets 9 and 10, respectively, lying in a second plane.

The frame further includes similarly shaped, movable upper front and fixed upper rear printed circuit board support beams 11 and 12, respectively, and movable lower front and fixed lower rear printed circuit board support beams 13 and 14, respectively, formed-up from sheet metal blanks to achieve strong, light-weight members. Each of the upper and lower front and rear support beams 11, 12, 13 and 14 include a longitudinally extending channel 15, which not only increases the moment of inertia of the beams but also serves as a receptacle for a resilient member 62. The resilient member 62, which may be a sponge rubber or similar material, will be discussed more in detail later in conjunction with the channel guides 40 and connector 50.

Each of the upper and lower front and rear beams 11, 12, 13 and 14 include slotted, outwardly extending guide mounting flanges 16. The slotted, guide mounting flanges 16 include a plurality of horizontally extending slots 17 disposed at uniformly spaced points along the longitudinal axis thereon. The horizontal slots 17 communicate with an outside edge 18 of the guide mounting flange 16. Each of the upper and lower front and rear beams 11, 12, 13 and 14 include a vertically, inwardly extending, slotted channel bar 19 having vertically extending slots 20 similar in shape to the horizontally extending slots 17 and aligned along similar points along the longitudinal axis thereon. The vertical slots 20 are adapted to receive the channel guides 40.

The upper rear support beam 12 is fixed perpendicularly to the upper right wall bracket 7 and the upper left wall bracket 8 in the first plane by any suitable manner, such as welding. Likewise, lower rear support beam 14 is fixed perpendicularly to the lower right wall bracket 9 and the lower left wall bracket 10 to form a self-standing, rigid frame structure.

The upper front support beam 11 is movably supported on upper right wall bracket 7 and upper left wall bracket 8 in the first plane. The upper front support beam 11 includes at its right and left sides elongated holes 21 over the upper right and upper left wall brackets 7 and 8, respectively. The elongated hole 21 has a major axis which is parallel to the vertical right and left wall members 3 and 4. The elongated hole 21 is adapted to receive an upper shoulder screw 22. The upper shoulder screw 22 is threaded into a threaded hole, not shown, in upper wall brackets 7 and 8. The upper shoulder screw 22 has a shank slightly longer than the material thickness of the upper front support beam 11 to permit the upper front support beam 11 to move towards, or away from, the upper rear support beam 12 while supported on top of the upper right and the upper left wall brackets 7 and 8, respectively.

The upper front support beam 11 is moved in the first plane towards, or away from, the upper rear support beam 12 incrementally in response to movement of two adjusting screws 23. The two adjusting screws 23 are supported in a horizontal position by an upper bent-up right bracket 25 on vertical right wall member 3 and an upper bent-up left bracket 26 on vertical wall 4. The adjusting screws 23 extend through clearance holes in upper bent-up right and left brackets 25 and 26, respectively, and are threaded into aligned threaded holes 29 on the right and left sides of the upper front support beam 11.

Lower front support beam 13 is movably supported in a manner substantially similar to the mounting of the upper front support beam 11. The lower front support beam 13 is movably supported on top of the lower right wall bracket 9 and lower left wall bracket 10 in the second plane. The lower front support beam 13 includes, at its right and left sides, elevated elongated holes 31 over the lower right and lower left wall brackets 9 and 10, respectively. The elongated hole 31 has a major axis which is parallel to the vertical right and left wall members 3 and 4. The elongated hole 31 is adapted to receive a lower shoulder screw 33. The lower shoulder screw 33 is threaded in a threaded hole, not shown, in lower wall brackets 9 and 10, respectively. The lower shoulder screw 33 has a shank slightly longer than the cross-sectional height of the support beam 13 to permit the lower support beam 13 to move towards, or away from the lower rear support beam 14 while supported on the lower right and left brackets 9 and 10.

The lower front support beam 13 is movable towards, and away from, the lower rear support beam incrementally in response to movement of two adjusting screws 34. The adjusting screws 34 are supported in a horizontal position by a lower right bent-up bracket 35 on vertical wall member 3 and lower left bent-up bracket 36 on vertical wall member 4. The adjusting screws 34 extend through clearance holes in bent-up brackets 35 and 36, respectively, and are threaded into aligned threaded holes 39 on the right and left sides of the lower front support beam 13.

Referring now to FIGURES 1 and 4, there is shown in FIGURE 4 the printed circuit board channel guide 40 formed-up from a blank of sheet metal. The channel guide 40 includes a base 41, right and left side pieces 42 and 43, respectively, a proximal T tab 44, and a distal T tab 45. The right and left side pieces 42 and 43 extend forwardly from the base 41 in a direction diametrically opposite to the proximal and distal T tabs 44 and 45, respectively. The right and left side pieces 42 and 43 are spaced apart a given distance slightly more than the thickness of the printed circuit board 2 to receive one edge of the printed circuit board 2. The proximal and distal T tabs 44 and 45 are similar in shape, each having a neck portion 46 only slightly narrower than the horizontal slots 17 in the slotted mounting flange 16 and a head portion 47 which is wider than the horizontal slots 17. The length of the neck portion 46 is slightly longer than the thickness of the slotted horizontal mounting flange 16. The base 41 includes a rectangular opening 48 near the distal T tab 45. The rectangular opening 48 includes a rim 49. The rectangular opening 48 and rim 49 will be discussed more in detail in conjunction with the mounting details of the electrical connector 50.

Referring to FIGURE 1 again, a pair of channel guides 40 are coupled to the cell 1. One of the channel guides 40 in the pair is spanningly supported on the lower front beam 13 and the lower rear beam 14. The proximal T tab 44 is held captive in a horizontal slot 17 in the lower front support beam 13 and the distal T tab 45 is held captive in a corresponding horizontal slot 17 in the lower rear support beam 14. The other one of the channel guides 40 in the pair is spanningly supported by the upper front beam 11 and the upper rear beam 12. The other one of the channel guides 40 is suspended by the proximal T tab 44 and the distal T tab 45 on mounting flange 16 of the upper front and upper rear beams 11 and 12 respectively. The upper and lower front and rear beams 11, 12, 13 and 14 are shown in a locked position in FIGURES 1–3. In this locked position, the front and rear beams are spaced apart a given distance substantially equal to the separation distance between the proximal and distal T tabs 44 and 45, respectively.

Referring now to FIGURE 2, there is shown a front view of the cell 1 having a plurality of pairs of channel guides 40 in preselected positions. It will be noted that some of the pairs of channel guides 40 are purposely left out. In accordance with the present invention, the channel guides 40 can be added, removed, or rearranged to suit a particular need. The minimum spacing between adjacent channel guides in FIGURE 2 is predicated upon the width of the electrical connector 50 and/or the height of components located on a side of the printed circuit board 2. Other types of electrical connectors may occupy less lateral space and, accordingly, the channel guides 40 may be spaced closer together.

Referring now to FIGURE 3, there is shown a cross-sectional view of FIGURE 2 taken through line 3—3 showing the universal cell 1 and features of the invention more in detail. As was stated before, the upper rear and lower rear beams 12 and 14 are fixed to the right and left vertical wall members 3 and 4. The channels 15 in each of the upper and lower rear beams 12 and 14 are diametrically opposed to one another. Traversing each of the channels 15 are a pair of channel guides 40, shown in sectional view. The rectangular openings 48 in each of the channel guides 40 traverses the channels 15 in the upper and lower rear beams 12 and 14 to permit mounting of the connector 50 in a manner to be described below.

The electrical connector 50 includes an upper and lower mounting tang 51 and 52, respectively. The upper and lower mounting tangs 51 and 52 project into channels 15 of the upper and lower rear beams 12 and 14. The upper and lower tangs 51 and 52 include upper and lower notches 53 and 54, respectively, communicating with the trailing edge 55 of the connector 50. The upper notch 53 includes a vertical surface 56 and a horizontal surface 57. The lower notch 54 includes a vertical surface 58 and a horizontal surface 59. The distance between the upper and lower notches 53 and 54 is substantially equal to the separation distance between the pair of channel guides 40 which are interposed between the upper and lower rear beams 12 and 14. And, more specifically, the separation distance between the horizontal surface 57 and horizontal surface 59 is substantially equal to the separation distance of the bases 41 of the pair of channel guides 40. The thickness of the upper and lower tangs 51 and 52 is only slightly less than the width of the rectangular opening 48 so that excellent alignment is achieved between the channel guides 40 and the connector 50 and printed circuit board 2.

The upper and lower tangs 51 and 52 further include upper and lower leading edge surfaces 60 and 61, each spaced a given horizontal distance from the vertical surfaces 56 and 58, respectively. The given horizontal distance bears a relationship with the channels 15 in the upper and lower support beams 12 and 14 and the channel guides 40. FIGURE 3 shows the channel guides 40 secured between the upper and lower front and rear beams 11, 12, 13 and 14, and the connector 50 being held captive between the pair of channel guides 40. The upper and lower tanks 51 and 52 are prevented from moving vertically by the horizontal surfaces 57 and 59 on upper and lower tangs 51 and 52. The channel guides 40 also urge the connector against the edge of the channel 15 preventing the connector 50 from moving towards the front or rear of the cell 1. The rim 49 in the channel guide prevents the connector 50 from moving laterally. Thus, the connector 50 is not only held in alignment with channel guides 40 but actually held in place by the channel guides. It should also be noted that the electrical connector 50 "floats" between the upper rear beam 12 and the lower rear beam 14 in channels 15.

Referring to FIGURES 1 and 3, a resilient member 62 fills the channel 15 of each of the support beams 11, 12, 13 and 14 and extends slightly above the channel. The resilient member 62 is interposed between the channel guides 40 and the support beams 11, 12, 13 and 14. The resilient member 62 yieldingly urges the channel guides 40 inwards putting a drag on printed board 2 which may be inserted between the pair of channel guides. The resilient member 62 also dampens vibrations in the support beams 11, 12, 13 and 14 and the channel guides 40. The resilient member 62, while desirable, may be omitted without hindering the operation of the invention.

The operation of the cell will first be explained in conjunction with the insertion of channel guides 40 and electrical connector 50. Before adding the channel guides 40 and the connector 50, the upper and lower front beams 11 and 13 are moved inwardly in response to the turning of the adjusting screws 23 and 34, respectively, in the appropriate direction. The upper and lower front beams 11 and 13 may be moved inwardly until stopped by the shoulder screws 22 and 33, respectively, coacting with one end of the elongated holes 21 and 31, respectively. One of the channel guides 40 may now be hooked into a desired slot 17 on the upper rear beam 12 by the distal tab 45. The channel guide 40 is then pivoted on the distal tab 45 and guided into the vertical slot 20 of the upper rear beam 12 and urged towards the upper front beam 11 and placed in a corresponding vertical slot 20 and horizontal slot 17 on the upper front beam 11. The channel guide 40 is then moved towards the upper rear beam 12 to a position where the rectangular opening 48 fully traverses the channel 15 in the upper rear beam 12. Likewise, the other corresponding channel guide 40 is hooked into a diametrically opposite slot 17 in the lower rear beam 14 by the distal T tab 45. The channel guide 40 is then pivoted on the distal T tab 45 and guided into the vertical slot 20 of the lower rear beam 14 and urged towards the lower front beam 13 and placed in a corresponding vertical slot 20 and horizontal slot 17 on the lower front beam 13. The channel guide 40 is then moved towards the lower rear beam 14 to a position where the rectangular opening 48 fully traverses the channel 15. The cell is now ready to accept an electrical connector 50. If desired in this position, channel guides may be added or removed and locked in place upon movement of the front support beams 11 and 13.

In order to add the electrical connector 50, the lower tang 52 is inserted into the channel guide openings 48, which traverses the lower rear beam 14. The electrical connector 50 is then pivoted on the resilient member 62 disposed in the channel 15. As was mentioned before, the resilient member 62 may be omitted, in which case, the connector is pivoted about notch 54. The resilient member 62, if present, is compressed to allow the electrical connector 50 to pass under the upper rear beam 12. The upper tang 51 is then inserted up into a corresponding opening 48, which traverses the upper rear beam 12. The resilient member 62, disposed in each of the channels 15 in the upper and lower beams 12 and 14, yieldingly holds the electrical connector 50 in a neutral position such that the first upper and lower notches 53 and 54, respectively, are in alignment with the pair of channel guides 40. If the resilient member 62 is omitted, the connector 50 is "hooked" onto the pair of channel guides 40 by the horizontal surfaces 57 and 59 of upper and lower tangs 51 and 52, respectively.

After the connector is hooked on the pair of channel guides 40, the adjusting screws 23 and 34, respectively, are turned in the proper direction, the front beams 11 and 13 are moved away from the rear beams 12 and 14, respectively. The upper and lower front beams 11 and 13 urge the channel guides 40 towards the front beams and, at the same time, the channel guides 40 urge the connector 50 to move under the rear support beams 12 and 14 until the upper and lower leading surfaces 60 and 61, respectively, abut the side of the channel 15 of the upper and lower rear beams 12 and 14, respectively. Rim 49 in each of the channel guides 40 coacts with notches 53 and 54. Thus, in accordance with the invention, the channel guides 40 and connectors 50 are simply locked into place, upon horizontal movement of the upper and lower front beams 11 and 13.

It will be obvious to those skilled in the art that the invention may find wide application with appropriate modifications to meet individual design circumstances but without substantial departure from the essence of the invention. For example, the proximal and distal T tabs 44 and 45 may have a modified shape still having a head portion and a neck portion. It is not, therefore, desired that the invention be limited to the specific arrangement shown and described herein, and it is intended in the appended claims to cover all such modifications as fall within the true spirit and scope of the invention.

What is claimed is:

1. In a universal cell for slidably mounting a plurality of printed circuit boards in spaced, parallel relation, the combination comprising, a load-bearing frame including upper and lower front, longitudinally extending, opposed guide support beams and upper and lower rear, longitudinally extending opposed guide support beams, said upper front and upper rear beams spaced a given first distance apart, said lower front and lower rear beams spaced a distance substantially equal to said given first distance apart, each of said upper and lower front beams presenting outwardly directed front mounting flanges lying substantially in given upper and lower parallel planes, respectively, each of said upper and lower rear beams presenting outwardly directed rear mounting flanges lying substantially in said upper and lower planes, respectively, each of said outwardly directed front and rear mounting flanges on said upper and lower front and rear beams including similarly aligned slots communicating with the outwardly directed edge thereof spaced at given points along the longitudinal axis of said upper front and lower front and upper rear and lower rear beams, respectively, a plurality of pairs of readily detachable, similarly shaped, grooved printed circuit board guides, one of said guides in said pair being spanningly supported by said upper front and upper rear beams at corresponding ones of said given points along the longitudinal axis of said upper front and upper rear beams, the other one of said guides in said pair of guides being spanningly supported by said lower front and lower rear beams at points along the longitudinal axis of said lower front and lower rear beams in opposition to said corresponding ones of said given points along the longitudinal axis thereon, whereby said pair of guides are vertically and horizontally aligned to receive said one of said boards edgewise, each of said guides having first and second distorted T tabs on a side opposite to said grooves in said guides, said first and second distorted T tabs being substantially normal to the longitudinal axis of said guides, said first and second distorted T tabs being spaced a given distance apart substantially equal to said given first distance, said distorted T tabs including a stem portion slidable in said given slots in said mounting flanges, and means coupled to said frame for varying the separation distance between said beams from said given first separation distance to a given second separation distance, said given second separation distance being less than said given first separation distance, whereby said pair of guides are secured to said mounting flanges when said mounting flanges are separated said given first separation distance and detachable when said mounting flanges achieve said second separation distance.

2. In a universal cell for slidably mounting a plurality of printed circuit boards in spaced, parallel relation, the combination comprising, a load-bearing frame including movable upper and movable lower front, longitudinally extending, opposed guide support beams and fixed upper and fixed lower rear, longitudinally extending, opposed guide support beams, said movable upper front and fixed upper rear beams spaced a given first distance apart, said movable lower front and fixed lower rear beams spaced a distance substantially equal to said given first distance apart, each of said upper and lower front beams presenting outwardly directed front mounting flanges lying substantially in given upper and lower parallel planes, respectively, each of said upper and lower rear beams presenting outwardly directed rear mounting flanges lying substantially in said upper and lower planes, respectively, each of said outwardly directed front and rear mounting flanges on said upper and lower front and rear beams including similarly aligned slots communicating with the outwardly directed edge thereof spaced at given points along the longitudinal axis of said upper front and lower front and upper rear and lower rear beams, respectively, a plurality of pairs of readily detachable, similarly shaped, grooved printed circuit board guides, one of said guides in said pair being spanningly supported by said upper front and upper rear beams at corresponding ones of said given points along the longitudinal axis of said upper front and upper rear beams, the other one of said guides in said pair of guides being spanningly supported by said lower front and lower rear beams at points along the longitudinal axis of said lower front and lower rear beams in opposition to said corresponding ones of said given points along the longitudinal axis thereon, whereby said pair of guides are vertically and horizontally aligned to receive said one of said printed circuit boards edgewise, each of said guides having first and second headed tabs on a side opposite to said grooves in said guides, said first and second headed tabs being spaced a given distance apart substantially equal to said given first distance, said headed tabs including a neck portion slidable in said given slots in said mounting flanges, and means coupled to said frame for varying the separation distance between said beams from said given first distance to a given second separation distance, said given second separation distance being less than said given first separation distance, whereby said pair of guides are secured to said mounting flanges when said mounting flanges are separated said given first separation distance and detachable when said mounting flanges achieve said given second separation distance.

3. In a universal cell for slidably mounting a plurality of plate-like circuit cards in spaced, parallel relation, the combination comprising, a load-bearing frame including upper and lower front, longitudinally extending, movable, opposed card guide support beams and upper and lower rear, longitudinally extending, fixed, opposed card guide support beams, said upper front and upper rear beams spaced a given first separation distance apart, said lower front and lower rear beams spaced a distance substantially equal to said given first separation distance, each of said upper and lower front beams presenting outwardly directed front mounting flanges lying substantially in given upper and lower parallel planes, respectively, each of said upper and lower rear beams presenting outwardly directed rear mounting flanges lying substantially in said upper and lower planes, respectively each of said outwardly directed front and rear mounting flanges on said upper and lower front and rear beams including similarly aligned slots communicating with the outwardly directed edge thereof spaced at given points along the longitudinal axis of said upper and lower front and upper and lower rear beams, respectively, a plurality of pairs of readily detachable, similarly shaped, grooved guides, one of said guides in said pair of guides being spanningly supported by said upper front and upper rear beams at corresponding ones of said given points along the longitudinal axis of said upper front and upper rear beams, the other one of said guides in said pair of guides being spanningly supported by said lower front and lower rear beams at points along the longitudinal axis of said lower front and lower rear beams in opposition to said corresponding ones of said given points along the longitudinal axis thereon, whereby said pair of guides are vertically and horizontally aligned to receive one of said plate-like cards edgewise, each of said guides having first and second distorted T tabs on a side opposite to said grooves in said guides, said first and second distorted T tabs being substantially normal to the longitudinal axis of said guides, said first and second distorted T tabs being spaced a given distance apart substantially equal to said given first separation distance, said distorted T tabs including a stem portion slidable in said given slots in said mounting flanges, and means coupled to said frame and said upper and lower front beams for varying the separation distance between said upper front and rear beams and between said lower rear and front beams from said given first separation distance to a given second separation distance, said second separation distance being less than said given first separation distance, whereby said pair of guides are secured to said mounting flanges when said mounting flanges are separated said given first separation distance and detachable when said mounting flanges achieve said given second separation distance.

4. A universal cell for releasably mounting printed circuit board connectors and printed circuit boards of uniform width and thickness in spaced, parallel relation comprising, a box-like, rectangular, skeletal frame having a movable upper front beam and a fixed upper rear beam lying in an upper plane and a movable lower front beam and a fixed lower rear beam lying in a lower plane substantially parallel to said upper plane, first means for moving said upper front beam in said upper plane substantially parallel to said upper rear beam from a first given separation distance from said upper rear beam to a second separation distance from said upper rear beam, said first separation distance being more than said second separation distance, second means for moving said lower front beam in said lower plane substantially parallel to said lower rear beam from one separation distance from said lower rear beam to another separation distance, said one separation distance being substantially equal to said first separation distance and said other one separation distance being substantially equal to said second distance, a plurality of pairs of spaced-apart longitudinal printed circuit board guides of uniform length for orthogonally receiving said printed circuit boards between said upper and lower planes, said printed circuit board guides having a longitudinal groove on one side for receiving one edge of said printed circuit board and spaced-apart proximal and distal headed tabs on the diametrically opposite side thereof, upper coupling means fixed to said upper front beam and said upper rear beam coacting with said proximal and distal headed tabs for securing one of said guides in said pair of guides to said upper front beam and said upper rear beam in response to positioning of said upper front beam in said first separation distance, said one of said pair of guides being releasable in response to said upper front beam being positioned in said second separation distance from said upper rear beam, lower coupling means fixed to said lower front beam and said lower rear beam coacting with said proximal and distal tabs for securing one of said pairs of guides to said lower front beam and said lower rear beam in response to positioning of said lower front beam in said one separation distance from said lower beam, said other one guide of said pair of guides being releasable in response to said lower front beam being positioned in said other one separation distance from said lower rear beam, and said upper and lower coupling means further providing for vertical and horizontal alignment of said pair of printed circuit board guides.

5. In a universal cell for releasably mounting printed circuit boards and coacting printed circuit board electrical connectors in spaced, parallel relation, orthogonally between first and second parallel planes, the combination comprising, a skeletal frame of generally parallelepiped configuration having like constructed, longitudinally extending, movable, upper front, and fixed, upper rear beams having upper, outwardly directed, mounting flanges lying in said first plane and movable, lower front and fixed, lower rear beams having lower, outwardly directed mounting flanges lying in said second plane, said upper rear beam and lower rear beam being opposed with respect to each other, each of said upper rear and lower rear beams having a longitudinal channel along the opposing surfaces thereof, a plurality of longitudinal pairs of similarly constructed guides each having a printed circuit board receiving channel for slidably mounting said printed circuit boards and releasably mounting said printed circuit board electrical connectors therebetween, each of said guides in said pair of guides including proximal and distal headed tabs spaced a given distance apart on opposite ends thereof, said upper, outwardly directed, mounting flanges of said upper front and upper rear beams having aligned slots communicating with the outside edge thereof for receiving said proximal and distal headed tabs, respectively, to cause one of said guides in said pair of guides to be spanningly supported by said upper front and upper rear beams, respectively, said lower, outwardly directed, mounting flanges of said lower front and lower rear beams having aligned slots communicating with the outside edge thereof for receiving said proximal and distal tabs to cause said other one of said guides in said pair of guides to be spanningly supported by said lower front and lower rear beams, respectively, each of said guides in said pair of guides including an elongated hole transverse to said longitudinal channels in said upper rear and lower rear beams for receiving an end of one of said electrical connectors, each of said connectors including notched means coacting with said elongated holes in each of said guides in said pair of guides for securing said connector between said pair of guides, and releasing means coupled to said frame for moving said upper front and lower front beams to cause said connector and said pair of guides to be releasable from said frame.

6. In a universal cell for releasably mounting printed circuit boards and coacting printed circuit board electrical connectors in spaced, parallel relation, orthogonally between first and second parallel planes, the combination comprising, a skeletal frame of generally parallelepiped configuration having like constructed, longitudinally extending, movable, upper front, and fixed, upper rear beams having upper, outwardly directed, mounting flanges lying in said first plane and movable, lower front and fixed, lower rear beams having lower, outwardly directed mounting flanges lying in said second plane, said upper rear beam and lower rear beam being opposed with respect to each other, each of said upper rear and lower rear beams having a longitudinal channel along the opposing surfaces thereof, a plurality of longitudinal pairs of similarly constructed grooved guides having opposed receiving channels for slidably mounting said printed circuit boards and releasably mounting said printed circuit board electrical connectors therebetween, each of said guides in said pair of guides including proximal and distal headed tabs spaced a given distance apart on opposite ends thereof, said upper, outwardly directed, mounting flanges of said upper front and upper rear beams having aligned slots communicating with the outside edge thereof for receiving said proximal and distal headed tabs, respectively, to cause one of said guides in said pair of guides to be spanningly supported by said upper front and upper rear beams, respectively, said lower, outwardly directed mounting flanges of said lower front and lower rear beams having aligned slots communicating with the outside edge thereof for receiving said proximal and distal tabs to cause said other one of said guides in said pair of guides to be spanningly supported by said lower front and lower rear beams, respectively, each of said guides in said pair of guides including an elongated hole transverse to said longitudinal channels in said upper rear and lower rear beams for receiving an end of one of said electrical connectors, each of said ends of said connectors being disposed in said channels of said upper rear and lower rear beams, said connector including notched means coacting with said elongated hole in each of said guides in said pair of guides for securing said connector between said pair of guides, and releasing means coupled to said frame for moving said upper front and lower front beams to cause said connector and said pair of guides to be releasable from said frame.

References Cited in the file of this patent

UNITED STATES PATENTS

| | | |
|---|---|---|
| 2,701,346 | Powell | Feb. 1, 1955 |
| 2,967,284 | Bailey et al. | Jan. 3, 1961 |
| 2,976,510 | Blain | Mar. 21, 1961 |